US006828236B2

United States Patent
Lee

(12) United States Patent
(10) Patent No.: US 6,828,236 B2
(45) Date of Patent: Dec. 7, 2004

(54) METHOD FOR FORMING SILICIDE WIRES IN A SEMICONDUCTOR DEVICE

(75) Inventor: Dong-Hun Lee, Anyang (KR)

(73) Assignee: Samsung Electronics Co., Ltd. (KR)

( * ) Notice: Subject to any disclaimer, the term of this patent is extended or adjusted under 35 U.S.C. 154(b) by 119 days.

(21) Appl. No.: 10/378,705

(22) Filed: Mar. 4, 2003

(65) Prior Publication Data

US 2004/0029348 A1 Feb. 12, 2004

(30) Foreign Application Priority Data

Jul. 25, 2002 (KR) .............................................. 02-43843

(51) Int. Cl.$^7$ .............................................. H01L 21/44
(52) U.S. Cl. ..................................................... 438/683
(58) Field of Search ................................ 438/197, 233, 438/591, 592, 642, 648, 649, 650, 651, 663, 664, 682, 683, 685; 257/412, 413

(56) References Cited

U.S. PATENT DOCUMENTS

| | | | | |
|---|---|---|---|---|
| 5,387,535 A | * | 2/1995 | Wilmsmeyer | 438/621 |
| 5,736,461 A | | 4/1998 | Berti et al. | 438/651 |
| 5,889,331 A | * | 3/1999 | Bai | 257/768 |
| 5,891,785 A | * | 4/1999 | Chang | 438/305 |
| 5,902,129 A | | 5/1999 | Yoshikawa et al. | 438/592 |
| 5,911,114 A | * | 6/1999 | Naem | 438/684 |
| 6,180,469 B1 | * | 1/2001 | Pramanick et al. | 438/299 |
| 6,329,276 B1 | | 12/2001 | Ku et al. | 438/586 |
| 6,514,859 B1 | * | 2/2003 | Erhardt et al. | 438/664 |
| 6,521,528 B1 | * | 2/2003 | Asamura | 438/655 |
| 6,673,665 B2 | * | 1/2004 | Wieczorek et al. | 438/233 |

* cited by examiner

Primary Examiner—Carl Whitehead, Jr.
Assistant Examiner—Jennifer M. Dolan
(74) Attorney, Agent, or Firm—Mills & Onello LLP

(57) ABSTRACT

In an apparatus and method for forming a silicide wire in a semiconductor device, a first gate film is provided with a first silicide layer in a first region (for example a wiring region of the device that is relatively thicker than a second silicide layer on a second gate film in a second region of the device. In this manner, the operating speed of the semiconductor device is improved.

18 Claims, 4 Drawing Sheets

METHOD FOR FORMING SILICIDE WIRES IN A SEMICONDUCTOR DEVICE

BACKGROUND OF THE INVENTION

1. Field of the Invention

The present invention relates to a method of forming wires in a semiconductor device; and more particularly, to a method of forming silicide wires in a semiconductor device, in which operating speed can be improved by increasing the thickness of the silicide wire.

2. Description of the Related Art

Silicide films are commonly applied in semiconductor devices for reducing contact resistance with polysilicon materials, for example polysilicon materials found in source and drain regions of a device The use of cobalt silicide film has recently become popular for this purpose. It is preferable to form the cobalt silicide film in a bi-layer system composed of a silicon surface and a cobalt film, wherein the silicon surface has a crystal structure that is compatible with the cobalt silicide film. Further, the cobalt film is formed by an initial deposition of a capping layer made of Ti, TiW or TiN prior to cobalt reaction. The capping layer improves the electrical characteristics of the device and mitigates excessive oxidation of the cobalt. An example of a Ti capping layer is disclosed in U.S. Pat. No. 5,736,461, illustrating a process for preventing cobalt oxidation during silicide formation.

In a typical cobalt silicide film process, the cobalt silicide film of uniform thickness is formed on a source region, a drain region, and a polysilicon gate region of a semiconductor device. Since the thickness of the silicide film plays an important role in the performance of the resulting semiconductor device, two separate semiconductor devices having mutually different junction depths between source and drain regions can be provided in a single integrated circuit. In other words, in a semiconductor device having a relatively shallow source and drain junction depth it is required to form a comparatively shallow cobalt silicide film on the source and drain regions in order to reduce the risk of a "spiking" phenomenon. In a semiconductor device having a relatively deep junction depth it is required to form a comparatively thick cobalt silicide film on regions having the deep junction depth in order to reduce contact resistance.

FIGS. 1 and 2 are sectional views formation of silicide wiring in a conventional semiconductor device.

With reference to FIG. 1, in a semiconductor substrate 10, a device separation region 14 and a wire separation region 12 are formed in a trench isolation process. The trenches are filled with a dielectric material according to standard practices. The device separation region 14 is provided in order to isolate separate respective devices, and the wire separation region 12 isolates respective wires. Subsequently, ion implantation of a device channel is performed, and the top of the resultant structure is coated with polysilicon to form a polysilicon 22 gate structure that is pattered via a photo etching process. Next, appropriate ion implantation is performed. A gate spacer 20 is then formed, and a deep source/drain ion implantation is performed. On the resultant structure, material of Co, Ti or Ni etc. 24 is deposited, and then material nonreactive to a silicidation, such as TiN is deposited 26.

With reference to FIG. 2, following this, silicide reaction is performed in a thermal process, to thus form silicide films 16, 18, 28 in the device region 100 and the wiring region 200. At this time, in the device region 100, silicide films 16, 18 are formed on regions where source and drain of a transistor will be formed, and silicide film 28 is formed on a gate electrode 22. In the wiring region 200, a silicide film 28 is formed on structure 22A, which serves as a wire.

In the conventional wiring method, the semiconductor process continues to strive toward gate lengths of ever-decreasing size, and, as a result, gate thickness also continues to decrease. As a result, the thickness of the silicide for reducing gate resistance becomes thinner while the junction depth becomes shallower. Consequently, the wiring resistance of the gate poly is increased and the operating speed of the resulting device is therefore reduced due to increased RC delay.

SUMMARY OF THE INVENTION

It is therefore an object of the present invention to provide a method of forming silicide wires in a semiconductor device, in which a wiring resistance can be reduced and in which operating speed can be improved by thickening the gate silicide for a gate structure that is used as a wire in the semiconductor device.

Another object of the present invention is to provide a method of forming silicide wires in a semiconductor device, in which performance can be improved by reduction of resistance between a drain and source by using two transistors including a gate poly having mutually different thicknesses and a silicide layer having mutually different thicknesses, in the event that transistors are required that exhibit different input/output voltages and internal operating voltages.

In one aspect, the present invention is directed to a method of forming silicide contacts in a semiconductor device. A gate film and a gate spacer are formed on a substrate in a device region and a wiring region of the substrate. A first metal film reactive to silicide and a reactive barrier film are sequentially formed on the resultant structure. Photoresist is deposited on the device region, the reactive barrier film of the wiring region is therefore exposed. The exposed reactive barrier film is removed and, the photoresist is removed. A second metal film reactive to the silicide is formed on the resultant structure. A silicide reaction is performed on the resultant structure, thereby providing a first silicide film formed on the gate film of the wiring region that is greater in thickness than a second silicide film formed on the gate film of the device region.

The reactive barrier film may comprise, for example, TiN. The first and second metal films may comprise, for example, Co, Ti, or Ni In an optional embodiment, the reacting and non-reacting residuals are removed in a cleaning process after performing the silicide reaction. The silicide reaction may comprise a rapid thermal process.

The reactive barrier film is exposed by eliminating the photoresist formed on the wiring region while retaining the photoresist formed on the device region, through a photolithography process.

The gate film of the wiring region may comprise, for example, an interconnect wire, or a transistor gate.

In another aspect, the present invention is directed to a method of forming silicide wires in a semiconductor device. A gate film and a gate spacer are formed on a substrate in a device region and a wiring region of the substrate. A first metal film reactive to silicide and a reactive barrier film on the resultant structure are sequentially formed. Photoresist is deposited on the reactive barrier film. The photoresist formed on the wiring region is then removed so as to expose the reactive barrier film in the wiring region. The exposed reactive barrier film is removed and the photoresist in the device region is removed. A second metal film reactive to silicide on the resultant structure is formed after removing the photoresist in the device region. A silicide reaction is performed on the resultant structure, thereby providing a first silicide film formed on the gate film of the wiring region that is greater in thickness that a second silicide film formed on the gate film of the device region.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF PREFERRED EMBODIMENTS

Figure 1:
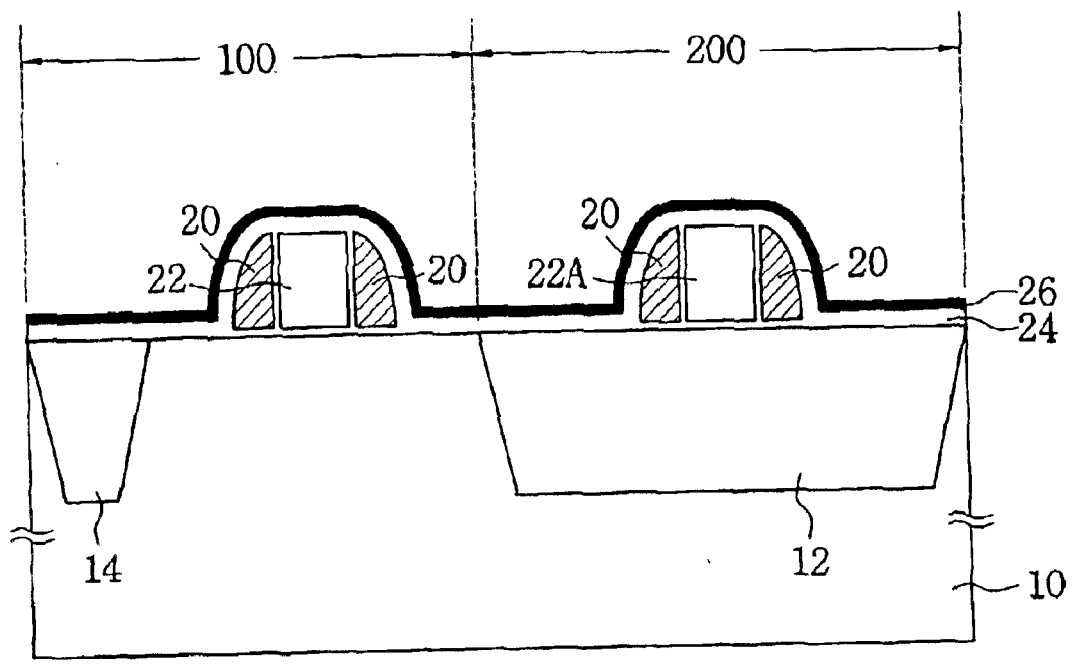
FIGS. 1 and 2 represent sectional views in forming silicide wires in a conventional semiconductor device.
Figure 2:
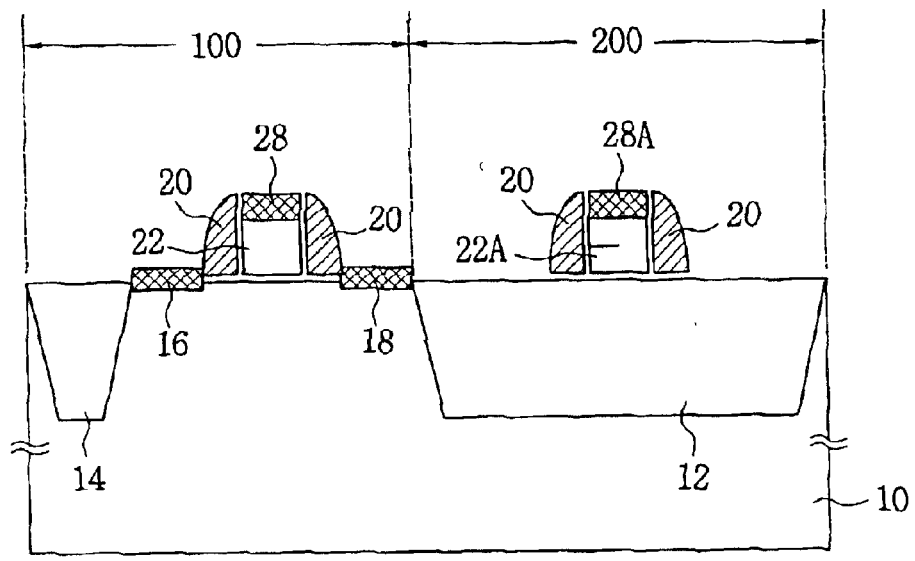

Hereinafter, preferred embodiments of the present invention will be described in detail with reference to the accompanying drawings. Like reference numerals refer to like components throughout the drawings.

FIGS. 3 through 7 are sectional views showing a fabricating process for forming silicide wires in a semiconductor device in accordance with an embodiment of the present invention.

Figure 3:
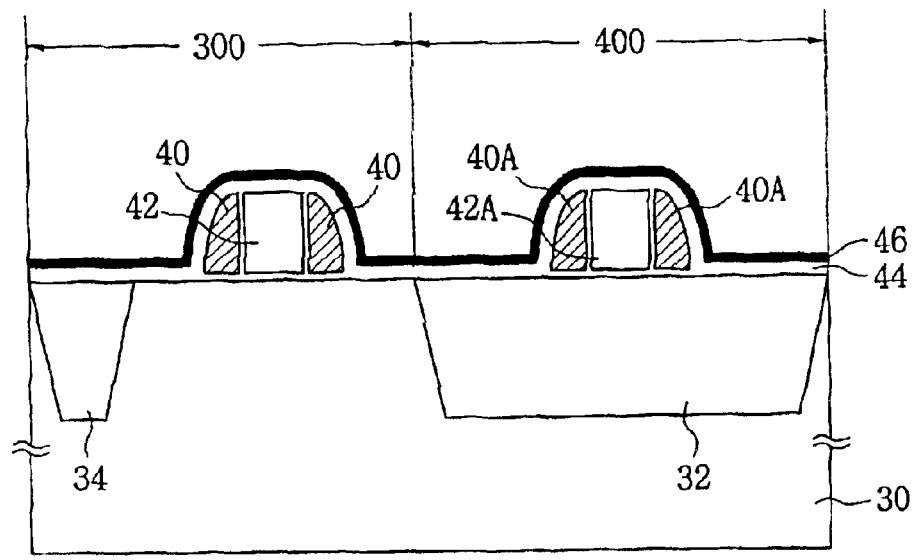
FIGS. 3 through 7 set forth sectional views in forming silicide wires in a semiconductor device in accordance with the preferred embodiment of the present invention.

In FIG. 3, a semiconductor substrate 30 comprises a device region 300 including respective devices and a wiring region 400 including wires, or interconnects. The device region 300 includes a device separation region 34 for isolating respective devices. The wiring region 400 includes a wire separation region 32 to provide for separation of wires. These device separation region 34 and wire separation region 32 are formed, for example, by a standard trench process in the semiconductor substrate 30. Following trench formation, the trenches are filled with dielectric material, e.g., oxide. Following this, an ion implantation process of the channel is performed. The top of the resulting structure is coated with a polysilicon layer. The polysilicon layer is patterned, for example using photo etching, to form a transistor gate 42 in the device region and a wire pattern 42A in the wiring region. Next, an appropriate ion procedure is executed to form source and drain regions of the device. After forming a gate spacer 40, and wire pattern spacer 40A, a deep source/drain ion implantation is performed. The entire surface of the resulting structure is deposited with a first metal film 44 reactive to silicide, for example comprising Co, Ti or Ni. Next, a reactive barrier film 46 is deposited. The reactive barrier film 46 comprises a material nonreactive to silicidation, such as TiN.

Figure 4:
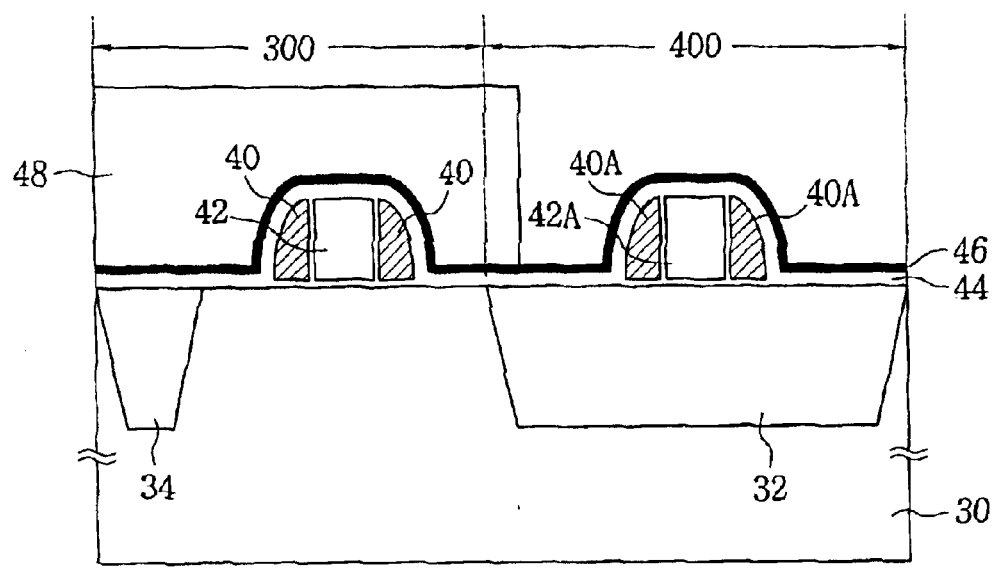

Next, with reference to FIG. 4, a layer of photoresist is deposited on the resultant structure. The photoresist is removed from the wiring region 400 using a photo etching process, to expose the portion of the reactive barrier film 46 deposited on the wiring region 400. Thus the photoresist 48 remains only in the device region 300.

Figure 5:
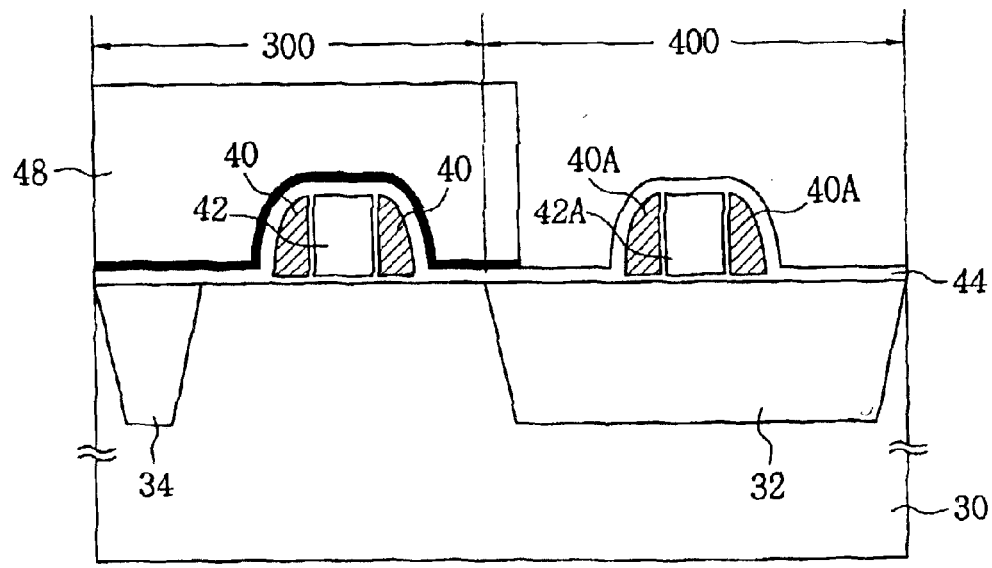

As shown in FIG. 5, the reactive barrier film 46 is removed in the exposed wiring region 400 is removed.

Assuming the reactive barrier film 46 comprises, for example, TiN, the reactive barrier film 46 is removed in a wet etching process using $H_2O_2$ having high selectivity to cobalt.

Figure 6:
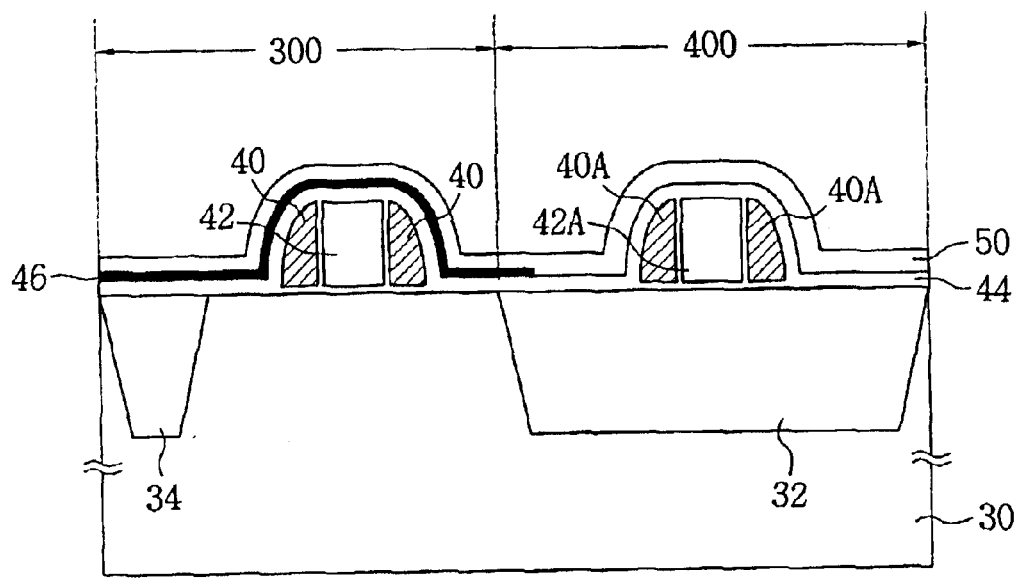

As shown in FIG. 6, after removing the photoresist 48 deposited on the device region 300 by the photo etching process, a second metal film 50 reactive to silicide, for example comprising Co, Ti or Ni, is deposited on the surface of the resulting structure. Subsequently, a silicide reaction is performed, for example by rapid thermal processing (RTP), in the device region 300 and the wiring region 400, so as to form a silicide film. After forming the silicide film, residue from the silicide reaction, for example any nonreactive metal film and nonreactive barrier film 46, are removed in a cleaning process. Silicide films 36, 38, 52, 54 are then formed within the device region 300 and the wiring region 400 as shown in FIG. 7.

At this time, in the device region 300, silicide films 36 and 38 are formed on regions corresponding to the transistor source and drain, while silicide film 52 is formed on the gate electrode 42. In the wiring region 400, silicide film 54 is formed on the polysilicon patter 42A that comprises the wiring structure.

Figure 7:
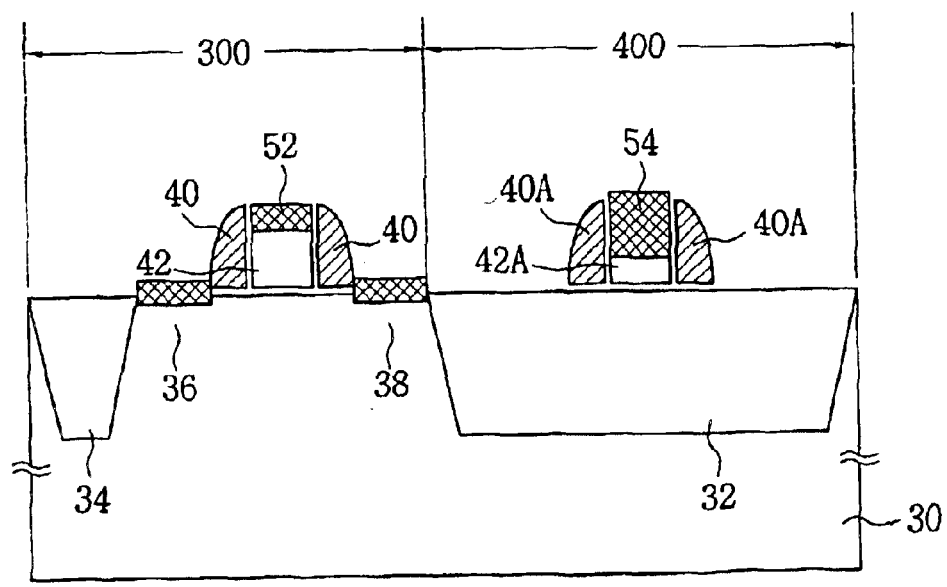

With reference to FIGS. 6 and 7, the silicide film formed in the device region 300 has a layered structure composed of the first metal film 44, the reactive barrier film 46 and the second metal film 50. The reactive barrier film 46 thus remains between the first and second silicide-reactive metal films 44, 50. Thus, in the device region 300, only the first metal film 44 reactive to the silicide reacts with the polysilicon gate pattern 42 so as to form the silicide film 52.

In the wiring region 400 however, owing to the absence of the barrier layer, the first and second silicide-reactive metal films 44, 50 both react with the polysilicon pattern 42A so as to form the silicide film 54. Since both metal layers 44, 50 react in the wiring. region 400, the resulting thickness of the silicide film 54 formed on the polysilicon wire pattern 42A is, for example, on the order of twice the thickness of the silicide film 52 formed on the gate pattern 42 of the device region 300. Accordingly, the operating speed of the semiconductor device is improved by reducing wiring resistance, since the thickness of the silicide film 54 on the wire pattern 42A is increased.

As described above, in accordance with the present invention, in fabricating a semiconductor memory device, a silicide film formed on a wire pattern in the wiring region is formed to a greater thickness than a silicide film formed on a gate pattern in the device region, so as to reduce a wiring resistance. Accordingly, the operating speed of an integrated circuit composed of a large number of transistors can be improved.

Further, the process of the present invention can be applied to the case where multiple transistors of different silicide film thicknesses are required. In this embodiment, the wire region 400 may comprise a second device region having a second gate pattern 42A, rather than a wiring pattern. This is especially applicable to an embodiment requiring a difference between I/O voltage and internal operating voltage; therefore, gate poly layers of mutually different thicknesses and silicide layers of mutually different thicknesses are used so as to improve the performance of the device resulting from a reduction in the resistance between the source and drain.

While this invention has been particularly described with reference to preferred embodiments thereof, it will be understood by those skilled in the art that various changes in form and details may be made therein without departing from the spirit and scope of the invention as defined by the appended claims.

What is claimed is:

1. A method of forming silicide contacts in a semiconductor device, comprising the steps of:

forming a gate film and a gate spacer on a substrate in a device region and a wiring region of the substrate;

sequentially forming a first metal film reactive to silicide and a reactive barrier film on the resultant structure;

depositing photoresist on the device region, and exposing the reactive barrier film of the wiring region;

removing the exposed reactive barrier film, removing the photoresist, and forming a second metal film reactive to the silicide on the resultant structure; and performing a silicide reaction on the resultant structure, thereby providing a first silicide film formed on the gate film of the wiring region that is greater in thickness than a second silicide film formed on the gate film of the device region.

2. The method of claim 1, wherein said reactive barrier film comprises TiN.

3. The method of claim 1, wherein said first and second metal films comprise Co.

4. The method of claim 1, wherein said first and second metal films comprise Ti.

5. The method of claim 1, wherein said first and second metal films comprise Ni.

6. The method of claim 1, further comprising the step of removing reacting and non-reacting residuals in a cleaning process after performing the silicide reaction.

7. The method of claim 1, wherein said silicide reaction comprises a rapid thermal process.

8. The method of claim 1, wherein said reactive barrier film is exposed by eliminating the photoresist formed on the wiring region while retaining the photoresist formed on the device region, through a photolithography process.

9. The method of claim 1 wherein the gate film of the wiring region comprises an interconnect wire.

10. The method of claim 1 wherein the gate film of the wiring region comprises a transistor gate.

11. A method of forming silicide wires in a semiconductor device, comprising the steps of:

forming a gate film and a gate spacer on a substrate in a device region and a wiring region of the substrate;

sequentially forming a first metal film reactive to silicide and a reactive barrier film on the resultant structure;

depositing photoresist on the reactive barrier film;

removing the photoresist formed on the wiring region so as to expose the reactive barrier film in the wiring region;

removing the exposed reactive barrier film, and removing the photoresist in the device region;

forming a second metal film reactive to silicide on the resultant structure after removing the photoresist in the device region; and performing a silicide reaction on the resultant structure, thereby providing a first silicide film formed on the gate film of the wiring region that is greater in thickness that a second silicide film formed on the gate film of the device region.

12. The method of claim 11, further comprising the step of removing reacting and non-reacting residuals in a cleaning process after performing the silicide reaction.

13. The method of claim 11, wherein said reactive barrier film comprises TiN.

14. The method of claim 11, wherein said first and second metal films comprise Co.

15. The method of claim 11, wherein said first and second metal films comprise Ti.

16. The method of claim 11, wherein said first and second metal films comprise Ni.

17. The method of claim 11 wherein the gate film of the wiring region comprises an interconnect wire.

18. The method of claim 11 wherein the gate film of the wiring region comprises a transistor gate.

* * * * *